United States Patent [19]

Boyd et al.

[11] Patent Number: 6,143,635
[45] Date of Patent: Nov. 7, 2000

[54] FIELD EFFECT TRANSISTORS WITH IMPROVED IMPLANTS AND METHOD FOR MAKING SUCH TRANSISTORS

[75] Inventors: Diane C. Boyd, Lagrangeville, N.Y.; Stuart M. Burns, Brookfield, Conn.; Hussein I. Hanafi, Goldens Bridge, N.Y.; Yuan Taur, Bedford, N.Y.; William C. Wille, Red Hood, N.Y.

[73] Assignee: International Business Machines Corporation, Armonk, N.Y.

[21] Appl. No.: 09/374,519

[22] Filed: Aug. 16, 1999

Related U.S. Application Data

[62] Division of application No. 09/026,094, Feb. 19, 1998.
[51] Int. Cl.[7] .................. H01L 21/3205; H01L 21/4763
[52] U.S. Cl. ........................ 438/585; 438/589; 438/593
[58] Field of Search .................................. 438/217, 289, 438/576, 585, 589, 593

[56] References Cited

U.S. PATENT DOCUMENTS

| | | |
|---|---|---|
| 4,471,523 | 9/1984 | Hu . |
| 4,745,083 | 5/1988 | Huie . |
| 5,073,512 | 12/1991 | Yoshino . |
| 5,075,242 | 12/1991 | Nakahara . |
| 5,376,578 | 12/1994 | Hsu et al. ................................ 437/56 |
| 5,413,949 | 5/1995 | Hong ...................................... 437/44 |
| 5,429,956 | 7/1995 | Shell et al. .............................. 437/29 |
| 5,444,008 | 8/1995 | Han et al. ................................ 437/45 |
| 5,472,897 | 12/1995 | Hsu et al. ................................ 437/44 |
| 5,489,543 | 2/1996 | Hong ...................................... 437/41 |
| 5,547,894 | 8/1996 | Mandelman et al. . |
| 5,578,508 | 11/1996 | Baba et al. .............................. 437/35 |
| 5,614,430 | 3/1997 | Liang et al. . |

FOREIGN PATENT DOCUMENTS

| | | |
|---|---|---|
| 7-193227 | 7/1995 | Japan . |
| 9-116154 | 5/1997 | Japan . |

OTHER PUBLICATIONS

R.A. Colclaser, John Wiley & Sons, "Micro Electronics Processing and Device Design," 1980, Chapter 10, pp. 266–269.

Primary Examiner—Matthew Smith
Assistant Examiner—Lex H. Malsawma
Attorney, Agent, or Firm—Scully, Scott, Murphy & Presser; Tiffany Townsend, Esq.

[57] ABSTRACT

Metal oxide semiconductor field effect transistor (MOSFET) including a drain region and a source region adjacent to a channel region. A gate oxide is situated on the channel region and a gate conductor with vertical side walls is placed on the gate oxide. The MOSFET further includes a threshold adjust implant region and/or punch through implant region being aligned with respect to the gate conductor and limited to an area underneath the gate conductor. Such a MOSFET can be made using the following method: forming a dielectric stack on a semiconductor structure; defining an etch window on the dielectric stack having the lateral size and shape of a gate hole to be formed; defining the gate hole in the dielectric stack by transferring the etch window into the dielectric stack using a reactive ion etching (RIE) process; implanting threshold adjust dopants and/or punch through dopants through the gate hole; depositing a gate conductor such that it fills the gate hole; removing the gate conductor covering portions of the semiconductor structure surrounding the gate hole; and removing at least part of the dielectric stack.

29 Claims, 9 Drawing Sheets

FIELD EFFECT TRANSISTORS WITH IMPROVED IMPLANTS AND METHOD FOR MAKING SUCH TRANSISTORS

RELATED APPLICATIONS

This application is a divisional of copending U.S. application Ser. No. 09/026,094, filed Feb. 19, 1998.

TECHNICAL FIELD

The present invention concerns metal-oxide-semiconductor field effect transistors (MOSFETs) in general, and MOSFETs with improved implants in particular.

BACKGROUND OF THE INVENTION

Field effect transistors (FETs) are the basic building blocks of today's integrated circuits. Such transistors can be formed in conventional substrates (such as a silicon substrate), or in silicon-on-insulator substrates. In both cases one introduces so-called deep implants into the substrate to improve the performance of the transistor, to provide heavy doping isolation for complementary metal-oxide (CMOS) integrated circuits, to reduce the current gain of parasitic vertical transistors, and to reduce the parasitic latch-up effect, just to mention some of the reasons why deep implants are used.

In CMOS technology, these deep implants are referred to as p-well or n-well deep implants. These p-well or n-well deep implants are needed if one forms NMOS-transistors (p-well) and PMOS-transistors (n-well) within one and the same substrate.

In addition to these deep implants, usually also threshold adjust implants ($V_T$ adjust implants) and punch through implants are employed to set the appropriate threshold voltage ($V_T$) for each transistor and to prevent punch through.

Figure 1A:
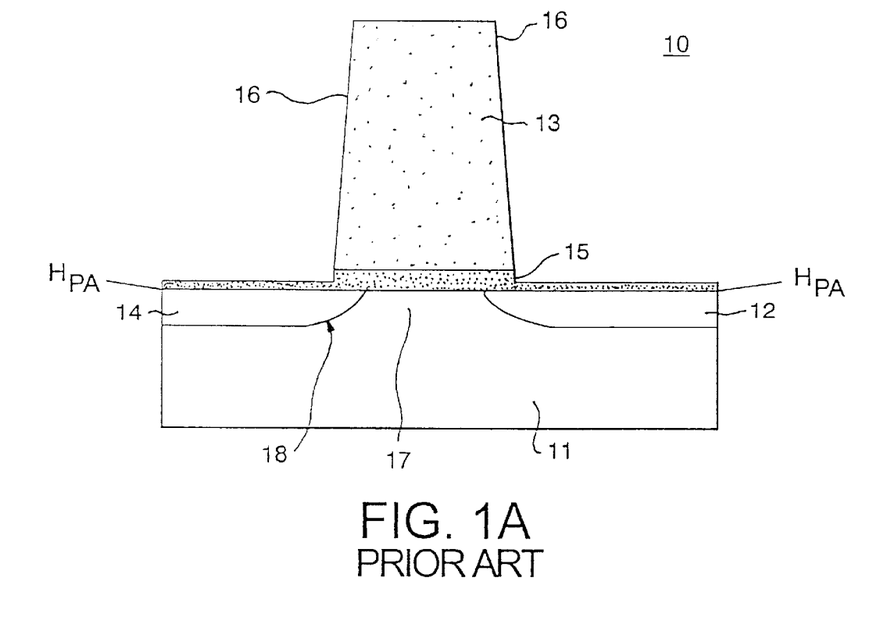
FIG. 1A. is a schematic cross section of the basic structure of a conventional FET.

A conventional MOSFET 10 is shown in FIG. 1A. Such a MOSFET is typically formed in a silicon substrate 11 and comprises a doped source region 14 and a doped drain region 12 being arranged to the left and right of a gate conductor 13. This gate conductor 13 is separated from the channel 17—which is situated between the source 14 and drain regions 12—by a date oxide layer 15. STI, LOCOS or poly-buffered LOCOS isolations (not shown) are usually employed to provide for isolation of adjacent transistors.

Figure 1B:
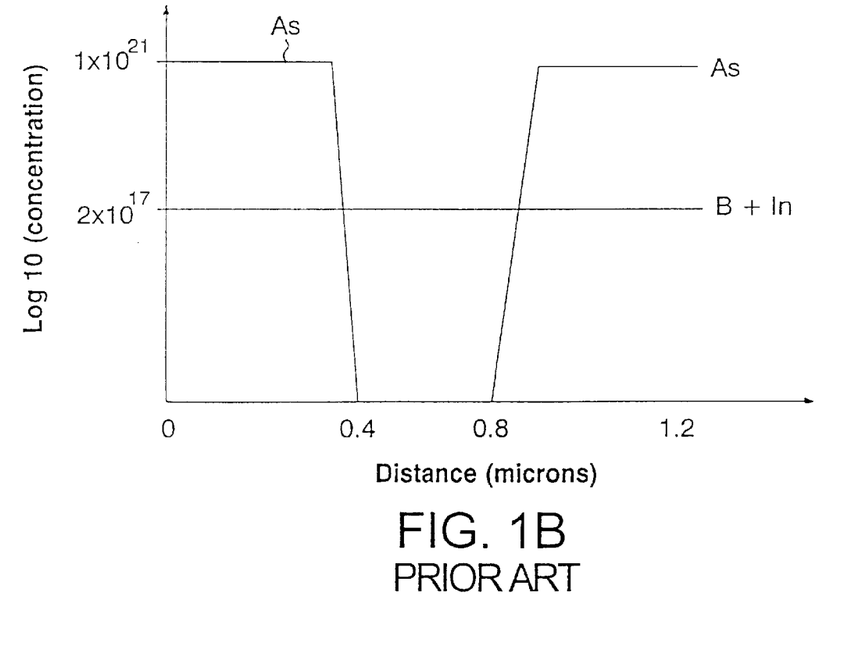
FIG. 1B. is a schematic diagram of the dopant concentration as a function of the distance (along $H_{PA}$—$H_{PA}$) of the basic structure of the conventional FET.

The dopant concentration as a function of the distance (cut $H_{PA}$—$H_{PA}$) is illustrated in FIG. 1B. Please note that this representation is schematical and is shown only to illustrate fundamental differences between know MOSFETs and MOSFETs according to the present invention. For the definition of the source and drain regions 12, 14 As implants have been used. The concentration of these dopants is about $1\times10^{21}/cm^3$. The interface 18 to the channel 17 is not well defined because of the sloped side walls 16 of the gate pillar 13, i.e. the As concentration decreases as a function of the distance (graded concentration at the interface 18). In a conventional MOSFET, the deep implants (e.g. boron; p-type) and the threshold adjust implants (e.g. indium, p-type) extend across the whole length of the transistor. The deep implants can be made using conventional techniques. These implants are usually made in preparation of the substrate before the actual FETs are formed. The combined concentration of B+In is about $2\times10^{17}/cm^3$.

Please note that with conventional processes it is impossible to provide threshold adjust implants and punch through implants which are localized underneath the channel 17 only.

There are currently no FET fabrication schemes known that would allow to realize FETs with threshold adjust implants and/or punch through implants being well defined and located underneath the channel only.

There is background art relating to various aspects of implanting dopants. Two examples are U.S. Pat. No. 4,471,523 and U.S. Pat. No. 5,547,894, both currently assigned to the assignee of the present application.

The present patent application is related to U.S. patent application Ser. No. 09/026,261, entitled "METHOD FOR MAKING FIELD EFFECT TRANSISTORS HAVING SUB-LITHOGRAPHIC GATES WILL VERTICAL SIDE WALLS", and U.S. patent application Ser. No. 09/025,093, entitled "FIELD EFFECT TRANSISTORS WITH VERTICAL GATE SIDE WALLS AND METHOD FOR MAKING SUCH TRANSISTORS", both filed on the same day and presently assigned to the assignee of the instant application. The disclosure of these two patent applications is incorporated herein by reference.

It is an object of the present invention to provide FETs having threshold adjust implants and/or punch through implants being located underneath the channel only.

It is an object of the present invention to provide FETs having threshold adjust implants and/or punch through implants being well defined.

It is another object of the present invention to provide a method for the formation of FETs having threshold adjust implants and/or punch through implants being located underneath the channel only.

It is another object of the present invention to provide a method for the formation of FETs having threshold adjust implants and/or punch through implants being well defined.

SUMMARY OF THE INVENTION

The above objectives have been accomplished by the provision of a new and inventive method for the formation of FETs, which allows to make FETs where the threshold adjust implants and/or punch through implants are located right underneath the channel region.

This method comprises the following steps of:
  forming a dielectric stack on a semiconductor structure;
  defining an etch window on the dielectric stack having the lateral size and shape of a gate hole to be formed;
  defining the gate hole in the dielectric stack by transferring the etch window into the dielectric stack using a reactive ion etching (RIE) process;
  implanting threshold adjust dopants and/or punch through dopants through the gate hole;
  depositing a gate conductor such that it fills the gate hole;
  removing the gate conductor covering the portions of the semiconductor structure surrounding the gate hole;
  removing at least part of the dielectric stack.

The inventive approach substitutes part of the conventional MOS or CMOS process steps usually employed for the formation of a gate conductor and the formation of threshold adjust implants.

The above process can be modified in different ways as will be addressed in the detailed description.

Some advantages of the inventive process are that
  the threshold adjust implants and/or punch through implants are located right underneath the channel;
  the threshold adjust implants and/or punch through implants are automatically aligned with respect to the gate conductor to be formed in the gate hole;

the expansion of the threshold adjust implant region and/or the punch through implant region is/are well defined and can be precisely controlled (note that there always be some lateral and vertical diffusion).

This is achieved mainly due to the fact that the threshold adjust implants and/or the punch through implants are implanted through a gate hole formed in a dielectric stack.

MOSFETs according to the present invention have a low source/drain junction capacitance than conventional MOSFETs, which results in an increased performance.

DESCRIPTION OF THE DRAWINGS

The invention is described in detail below with reference to the following schematic drawings (not drawn to scale):

FIGS. 3A–3N show key steps of a fabrication sequence according to the present invention.

DESCRIPTION OF PREFERRED EMBODIMENT:

In the present context, n⁺ or p⁺ doped semiconductors are meant to be heavily doped semiconductors. They typically have a concentration of dopants of at least $10^{19}$ to $10^{22}/cm^3$. n or p doped regions typically have a dopant concentration of $1\times10^{17}$ to $1\times10^{18}/cm^3$, and n⁻ or p³¹ doped regions have a concentration of about $10^{16}/cm^3$.

When using the word FET in the present context, any kind of field effect transistor, including MOSFETs, CMOS FETs, NMOS, PMOS and so forth are meant.

Figure 2A:
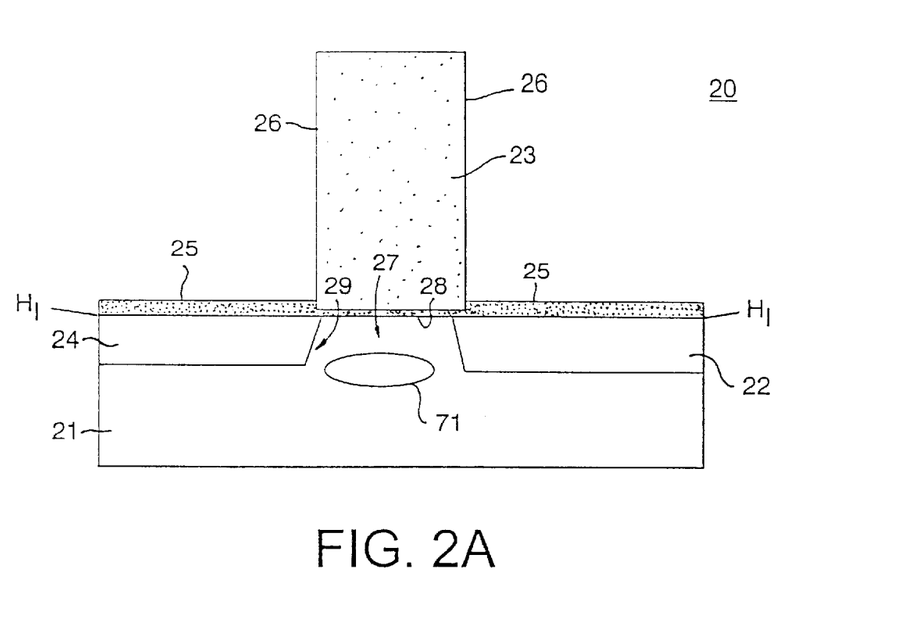
FIG. 2A is a schematic cross section of the basic structure of an FET, according to the present invention.

An FET 20, according to the present invention, is illustrated in FIG. 2A. It is formed in a semiconductor substrate 21. This substrate may be a silicon substrate, for example. In the present embodiment, a drain region 22 and a source region 24 are defined by n⁺ doping. Well suited for n-type doping are: P, As and Sb, for example. In the present embodiment As is used as dopant. For the definition of p-type source and drain regions B, In and Ga may be used. A polysilicon gate 23 is situated on top of a thin $SiO_2$ gate oxide 28. As in FIG. 1A, the electrodes employed for the contacting of gate, source, and drain are not shown. A threshold adjust and punch through implant region 71 is situated right between the drain region 22 and source region 24. The size and shape of this implant region 71 is well defined. The implant region 71 is aligned with respect to the gate conductor 23. Please note that the threshold adjust implant is usually formed close to the surface, whereas the punch through implant is situated somewhat underneath the threshold implant. The location (depth) of the threshold implant region and punch through implant region is mainly controlled by the energy at which the respective dopants are implanted. The punch through implant region is employed to prevent punch-through currents flowing between the drain and source regions 22, 24. This punch-through current flows parallel to the channel and cannot be controlled by the channel.

Figure 2B:
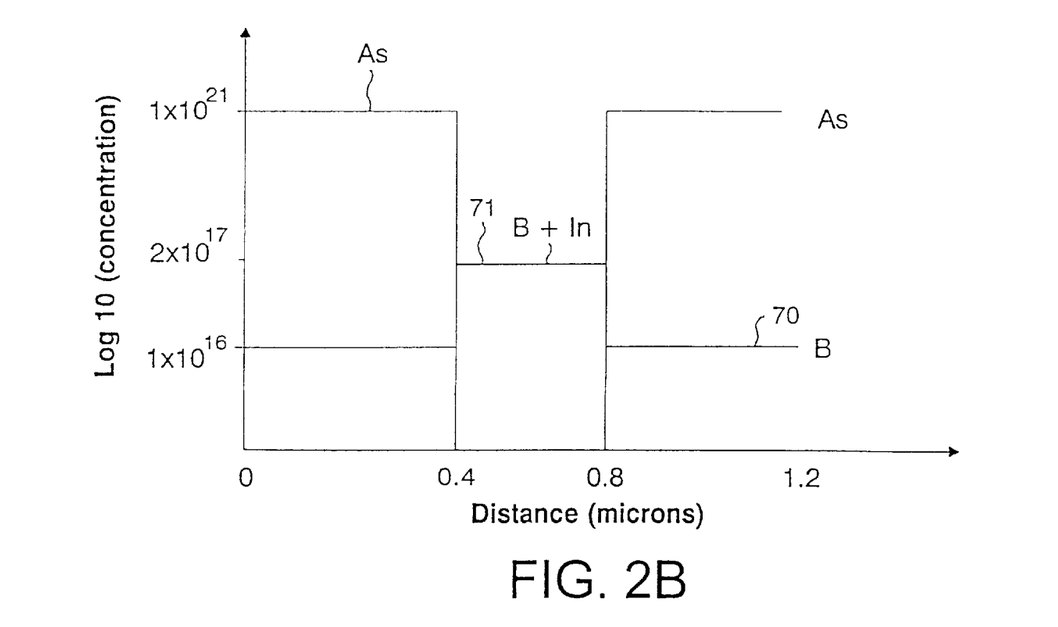
FIG. 2B. is a schematic diagram of the dopant concentration as a function of the distance (along $H_{PA}$—$H_{PA}$) of the FET, according to the present invention.

The dopant concentration as a function of the distance (cut $H_1$—$H_1$) is illustrated in FIG. 2B. Please note that this representation is schematical and is shown only to illustrate fundamental differences between known MOSEFTs (see FIG. 1B) and MOSFETs according to the present invention For the definition of the source and drain regions 24, 22 As implants have been used. The concentration of these dopants is about $1\times10^{21}/cm^3$. The interface 29 to the channel 27 is abrupt and well defined. Such well defined junctions can be obtained when using a gate hole for the formation of the gate conductor 23 as will be described later. Because of the gate conductor 23 has vertical side walls 26 the source and drain implants can be introduced into the substrate 31 such that the As concentration abruptly decreases when crossing the drain/channel or source/channel junction 29. According to the present invention, the deep implants 70 (e.g. boron) are introduced into the substrate through part of a dielectric stack which is used for the formation of a gate hole. Once this gate hole is formed, the threshold adjust implants and/or punch though implants 71 (e.g. indium) can be implanted through this hole right into the region underneath the channel 27. Indium is well suited because the indium ions do not tend to diffuse as fast and easy as other dopants. That is, the size and shape of the threshold adjust implant and/or punch though implant region 71 remains almost the same even if subsequent heat treatments are required. According to the present invention this is done before the gate conductor is formed in the gate hole. As shown in FIG. 2B, the deep implants 70 defining the background (well implants in case of CMOS) have a concentration of about $1\times10^{16}/cm^3$. The concentration of the threshold adjust implants 71 is about $2\times10^{17}/cm^3$ in the present embodiment. Please note that these adjust implants are located right underneath the channel 27, i.e. the dopant concentration underneath the channel is drastically increased.

It is an advantage of the inventive structure that its performance is improved. It is a further advantage that the punch-through is effectively prevented without increasing the source/drain resistance. The punch-though implant region can be designed to minimize short-channel effects and drain induced barrier lowering without effecting the source/drain capacitance.

Figure 3A:
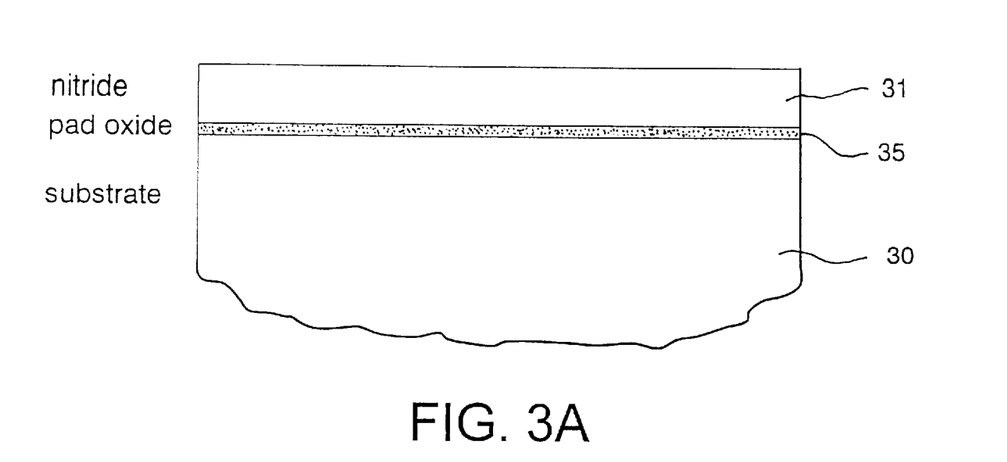
FIG. 3A shows a substrate covered by a pad oxide and a nitride layer.

A more detailed description of the invention will be given in connection with a sequence of steps (illustrated in FIGS. 3A–3N). It is to be noted that these steps not necessarily have to be executed in the order illustrated and described. The fabrication scheme according to the present invention, is also suited for the formation of FETs with very thin gate oxides (<5 nm) and FETs with sublithograpihc gates.

In the below described example, the formation of an FET, according to the present invention, begins with a substrate 30. This substrate is covered by a pad oxide layer 35 and a nitride layer 31. The substrate 30 may be a silicon substrate, for example. An 8 nm thick $SiO_2$ layer 35 may be used as pad oxide. The pad oxide layer is typically between 5 nm and 20 nm thick. The oxide layer 35 may be made by means of rapid-thermal processing (RTP) or furnace processing.

The nitride layer 31 may consist of $Si_3N_4$ and might have a thickness of about 90 nm. The nitride layer 31 can be made using a high temperature low pressure chemical vapor deposition (LPCVD) process, for instance. Other deposition methods are available, including plasma enhanced chemical vapor deposition (PECVD). Likewise, the nitride can be sputtered.

Figure 3B:
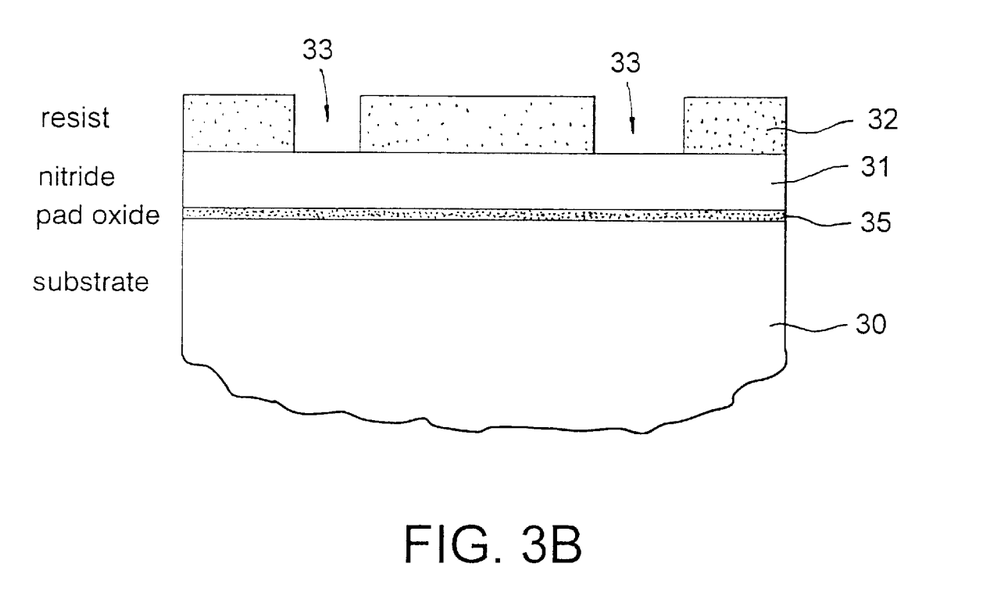
FIG. 3B shows an intermediate fabrication step after a photo resist has been patterned for the etching of STI or LOCOS isolation.

Next, a single-layer photo resist 32 is spinned onto the nitride layer 31. By means of lithography this resist layer 32 is then patterned to define etch windows 33 for a subsequent etch step, as shown in FIG. 3B. Instead of using a single-layer photo resist, a multi-layer resist, or any other mask, e.g. a hard-baked mask, can be used. The shape and size of the etch windows 33 defines the lateral dimensions of the shallow trench isolation (STI) trenches to be etched next. Such STIs (also known as field oxide isolation) are typically used in MOS and CMOS technology to provide for isolation between adjacent transistors. LOCOS (local oxidation of silicon) or poly-buffered LOCOS can be employed instead of STIs.

Figure 3C:
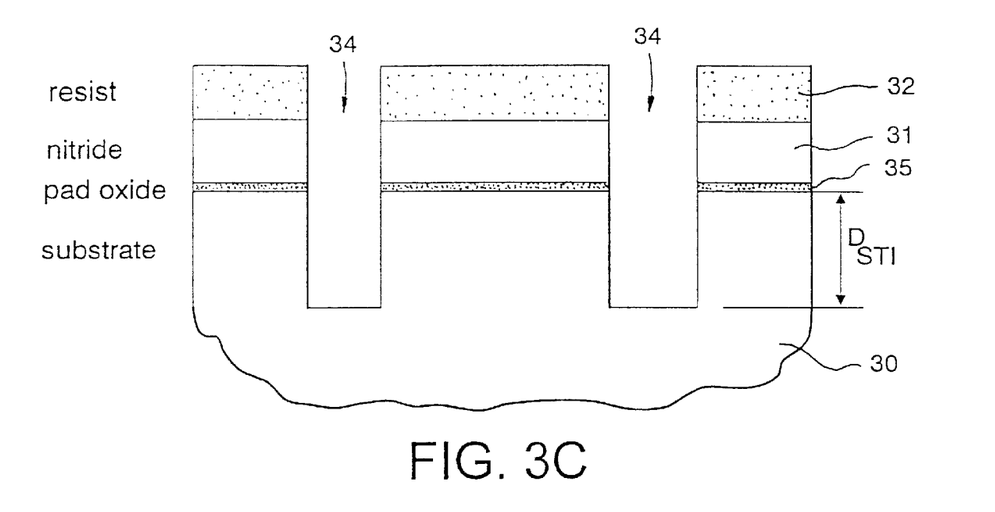
FIG. 3C shows an intermediate fabrication step where the photo resists has been used as etch mask for the etching of STI trenches.

As shown in FIG. 3C, the resist pattern in now transferred into the layered structure underneath by means of an appropriate etch technique. This step is non-critical. The depth $D_{STI}$ of the STI trenches 34 may be 100 nm and more. Before filling the STI trenches with a suited isolator, one may thermally grow a thin oxide layer 46 inside the trenches 34. This is recommended in particular if the trenches 34 are to be filled by tetra ethyl ortho silicate (TEOS), which is a deposited oxide. Deposited TEOS usually has surface states at the interface to the silicon substrate 30. Such surface states are not desired.

Figure 3D:
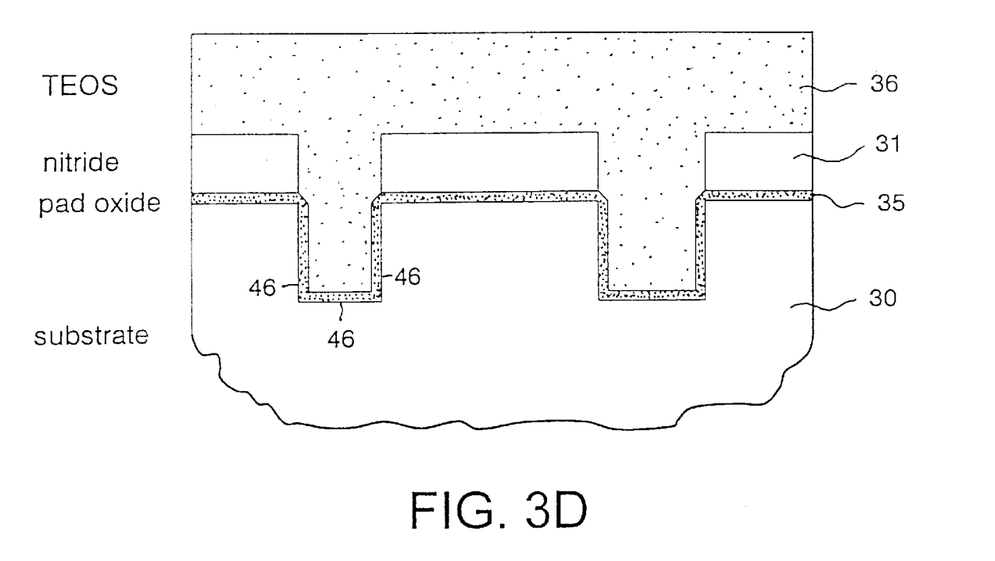
FIG. 3D shows an intermediate fabrication step where the STI trenches have been filled with a TEOS layer.

In the present example, the resist 32 is removed, a thin thermal oxide 46 is formed and then TEOS is deposited such that all STI trenches 34 are filled down to the bottom, as shown in FIG. 3D TEOS can be deposited using a low pressure chemical vapor deposition (LPCVD) process, for instance. Many other materials can be used instead of TEOS, as long a sufficient isolation of adjacent transistors (which are not shown in FIGS. 3A–3N) is guaranteed.

It is an advantage of TEOS that it provides for a very good stopping layer for any subsequent chemical mechanical polish (CMP) planarization step.

Figure 3E:
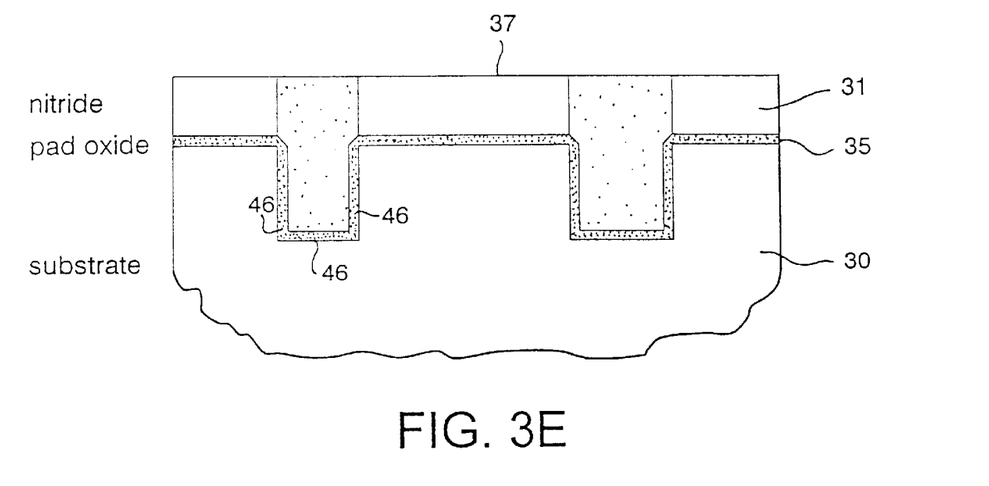
FIG. 3E shows an intermediate fabrication step where the TEOS and part of the nitride layer have been removed by means of planarization.

As schematically illustrated in FIG. 3E, the upper surface of the structure is now planarized using CMP, for example. In the present embodiment, the CMP removes the excess TEOS 36 and stops on the nitride layer 31. The upper surface 37 of layer 31 is now completely flat. After CMP, the thickness of this nitride layer 31 is slightly reduced to about 75 nm.

Figure 3F:
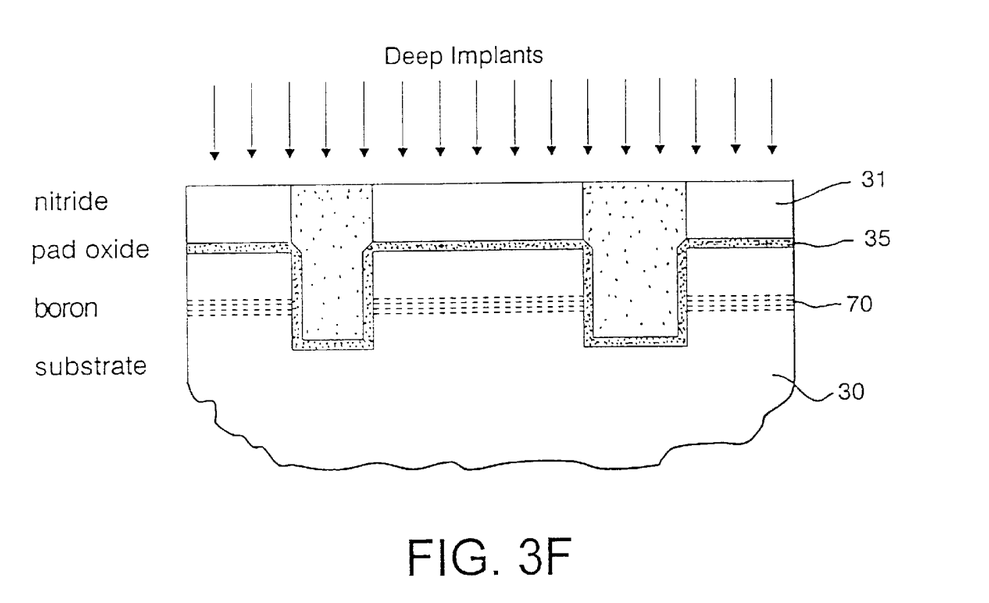
FIG. 3F shows an intermediate fabrication step where deep implants are introduced through the nitride layer.
Figure 3G:
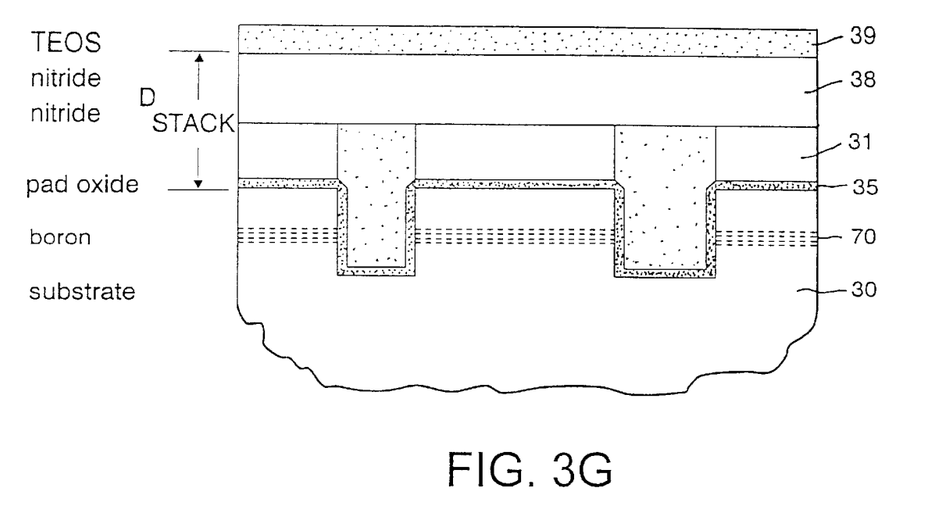
FIG. 3G shows an intermediate fabrication step where additional layers have been formed.

Now deep implants 70 are introduced into the substrate, as shown in FIG. 3F. In CMOS technology p-well deep implants and n-well deep implants are formed to allow the integration of NMOS and PMOS transistors in a common substrate. In the present embodiment boron is used as dopant. The boron ions are implanted through the nitride layer 31. Since this ion implantation is a high energy process, the nitride has almost no impact on the penetration depth of the ions. In a conventional CMOS process, the nitride layer is removed before formation of the deep implants. According to the present invention, however, the nitride layer is used to build a dielectric stack, as will be addressed in the following. One might remove the nitride layer completely before ion implantation, but this would add additional and unnecessary process steps.

In a subsequent step (see FIG. 3G), the dielectric stack on top of the pad oxide layer 35 is completed by forming additional layers on top of the planarized surface 37. In the present example, the dielectric stack comprises a $Si_3N_4$ nitride layer 31 (reduced to about 75 nm thickness), a $Si_3N_4$ nitride layer 38 (about 50 nm thick), and a TEOS layer 39 (about 60 nm thick).

The TEOS as well as the nitride can be deposited using LPCVD processes, for example. For reasons of compatibility with the existing device technologies, materials such as silicon or nitride and their respective oxides are preferred.

TEOS is well suited as uppermost layer of the dielectric stack because it can be precisely RIE etched. RIE etched TEOS has smooth surfaces. It serves as an excellent hard mask for subsequent RIE etching because the resist pattern can be exactly transferred into the TEOS. It is to be noted, however, that the TEOS is removed when etching the pad oxide at the bottom of the gate hole, as will be discussed in connection with FIG. 3J. The dielectric stack may likewise consist of a polymer, or it may comprise several polymer layers. Any other dielectric stack can be used, as long as it is guaranteed that this stack can be etched in a manner that gate holes with vertical side walls can be formed. It is also important, that highly selective etchants are available for the etching of the gate holes, as will be addressed in connection with FIGS. 3H and 3I. The dielectric stack—and the one or more layers of which it is composed—should be compatible with existing device technologies.

The dielectric stack may comprise nitride only. Such a nitride-only stack can be etched without attacking the silicon and pad oxide.

In the present embodiments, the dielectric stack is formed on top of a semiconductor structure which already comprises certain layers and structural elements, such as STI or LOCOS trenches. It is to be noted that the dielectric stack can be formed on any kind of semiconductor structure, including a simple substrate, a preprocessed substrate, a semiconductor device comprising other circuits, and so forth.

The expression gate pillar is used in the present context to describe gate structures protruding from the semiconductor structure The pillar can have any shape and size.

In a subsequent step, a photo lithographic process is used to define the lateral size of a gate hole to be formed. This step is not illustrated since there are many different ways how this can be done. Basically, an etch window 40 is provided in a resist mask 48 (see FIG. 3H), the size and shape of which is about the same as the lateral size and shape of the gate hole to be formed.

Figure 3H:
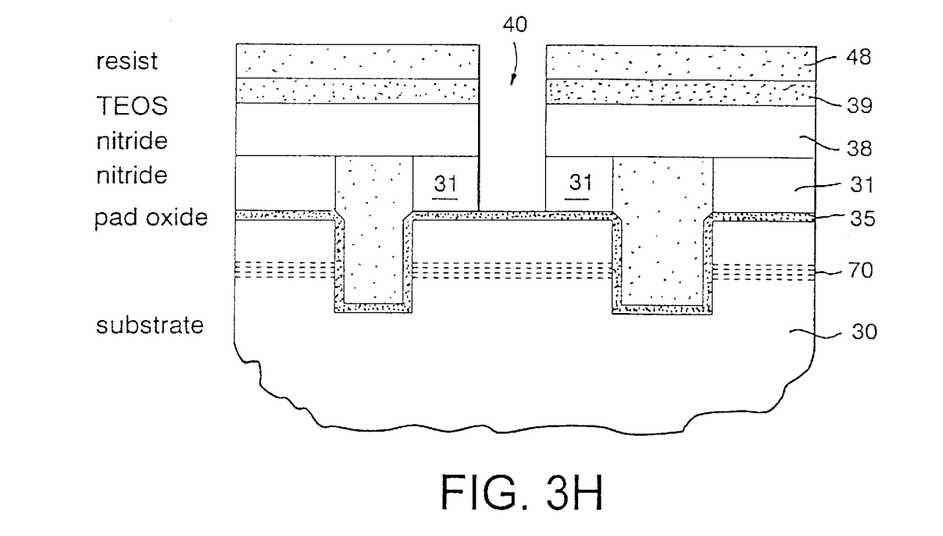
FIG. 3H shows an intermediate fabrication step after a photo resists has been added, lithographically patterned, and a gate hole with vertical side walls has be formed.

In the following, the late hole formation is described. A gate formation RIE process is employed to transfer the etch window 40 provided in the resist 48 into the dielectric stack (please note that this dielectric stack comprises in the present example nitride layer 31, nitride layer 38, and TEOS layer 39). The gate formation RIE process can be optimized to ensure proper etching of the various layers of the dielectric stack. Several RIE steps, each being optimized for the etching of the respective layer of the dielectric stack, may be carried out. When etching the TEOS layer 39, for example, the selectivity to nitride should be chosen appropriately. Well suited is a selectivity to nitride of 3:1 or better, which means that the TEOS is etched three times faster than the nitride. RIE processes are available which facilitate excellent vertical side walls throughout the dielectric stack. Once the etch window 40 has been precisely transferred into the TEOS layer 39, a second RIE step is carried out. This second RIE step is designed to have high selectivity to the pad oxide 35. A selectivity of nitride to the pad oxide of 5:1 and more is suited. A selectivity of at least 10:1 is preferred.

Figure 3I:
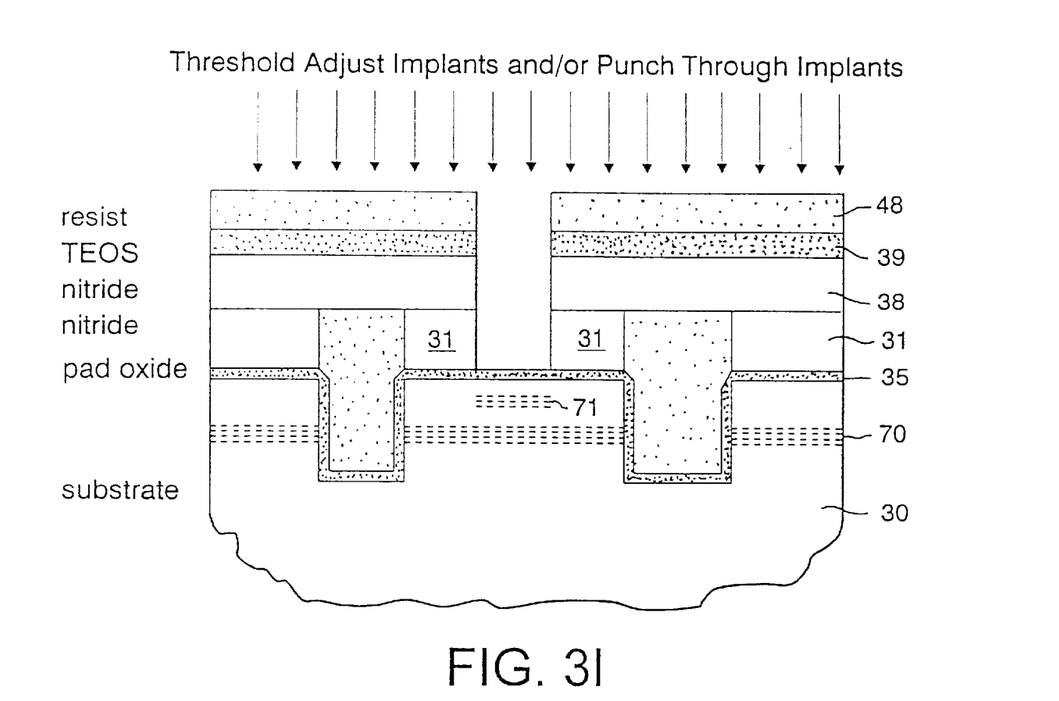
FIG. 3I shows an intermediate fabrication step where the threshold adjust implants and/or punch through implants are introduced into the substrate through the bate hole.
Figure 3J:
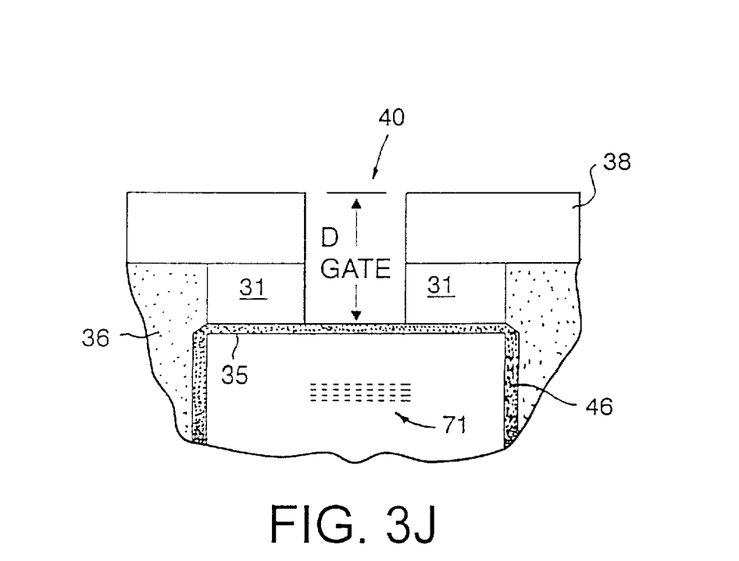
FIG. 3J is a magnified view of the gate hole, after the resist has been removed and the TEOS and pad oxide layer at the bottom of the gate hole has been etched away.

In the present example, the second step of the gate formation RIE process is designed to etch the nitride layers 38 and 31 of the dielectric stack and to stop on the pad oxide layer 35, as illustrated in FIG. 3I. This second RIE step is the last RIE step out of a sequence of separately optimized RIE steps. It is important that the selectivity to pad oxide is 5:1 or better, because otherwise the pad oxide 35 may be strongly attacked and its thickness reduced. The depth $D_{GATE}$ of the gate hole 40 (which is about the same as the thickness of the dielectric stack $D_{STACK}$ in FIG. 3G) defines the heights of the gate pillar including gate oxide, both yet to be formed. The pillar serving as Date typically is between 100 nm and 200 nm high ($H_G$), but may well be higher than that. Future CMOS FETs will have a gate length of 150 nm and even less Such short gates can be easily made using the inventive process. The width (out of the paper plane) of conventional gate electrodes may be between 2 $\mu$m and 50 $\mu$m.

After having defined the irate hole 40 in the dielectric stack, the threshold adjust dopants and/or the punch though dopants are introduced into the substrate 30, as shown in FIG. 3I. It is to be noted that, according to the present invention, either the threshold adjust dopants or the punch though dopants, or the threshold adjust dopants and the punch though dopants can be implanted through the gate hole 40 (for sake of simplicity the threshold adjust implant region and the punch though implant region are not shown as two separate regions). This can be done in a accurately controlled fashion, because the gate hole 40 allows dopants to reach the substrate only in a region immediately underneath it. The shape and size of the gate hole 40 thus defines the shape and size of the threshold implant and punch through implant region 71. It is to be noted, however, that due to lateral and vertical diffusion the boundaries of the implant regions may smear out a little. The threshold adjust dopants and punch through dopants are implanted using an ion implantation process at voltages of about 50 keV for Boron and 150 keV for Indium. The concentration of dopants in the threshold adjust and punch through implant regions is typically between $1\times10^{17}/cm^3$ and $1\times10^{18}/cm^3$.

According to the present invention, the peak of the Gaussian distribution of the threshold adjust implant region is located close to the gate oxide gate oxide 28. The peak of the punch through implant region is typically about 0.1 $\mu$m deep.

Due to the fact that the threshold adjust implant region and/or the punch through adjust region are formed by implanting dopants through the gate hole 40, these regions can be precisely placed such that they do not touch the drain region and source region.

Figure 3K:
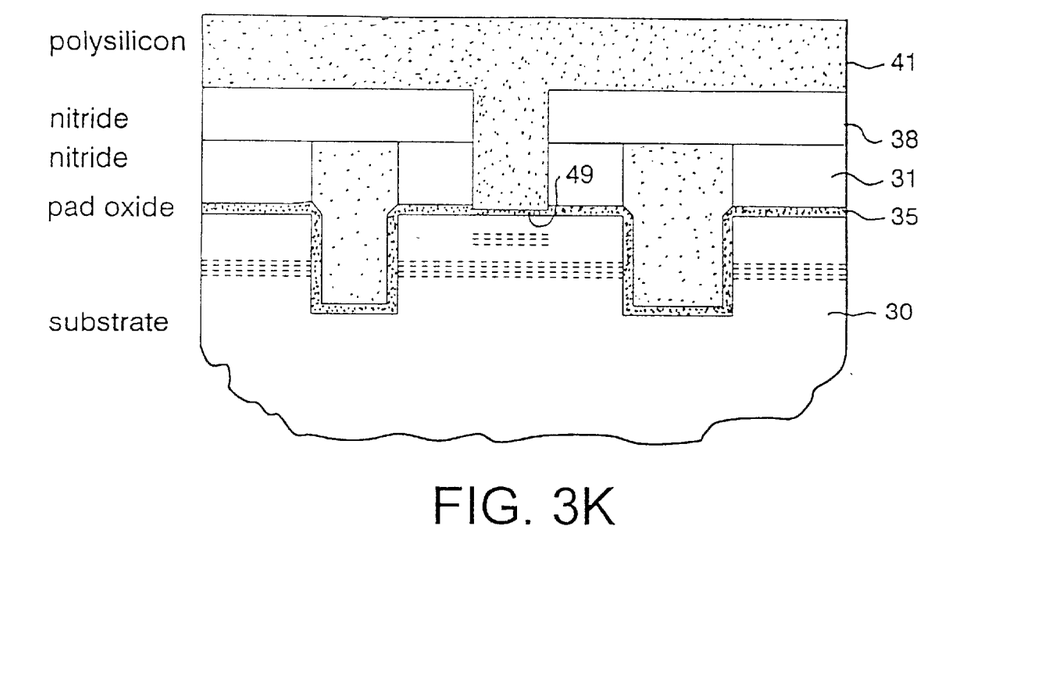
FIG. 3K shows an intermediate fabrication step where the gate hole has been filled with polysilicon. Please note that, before the gate hole is filled, a thin gate oxide layer is formed at the bottom of the gate hole.

Then, the leftover of the pad oxide 35 may be removed from the bottom of the hole 40. This can be done using an HF dip. HF is well suited because it attacks the oxide 35 and the TEOS 39 HF does not attack the silicon substrate 30. Before the removal of the TEOS 39 and pad oxide at the bottom of the gate hole 40, the resist is removed After the TEOS 39 and the pad oxide 35 is completely removed, see FIG. 3J, a precisely defined gate oxide 49 may be formed as shown in FIG. 3K. The thickness and quality of this gate oxide 49 is independent of the thickness and quality of the pad oxide layer 35. The gate oxide may also be thicker than the pad oxide, if so desired.

Before the formation of the gate oxide 49, a sacrificial oxide layer (not shown) may be formed at the bottom of gate hole 40. This sacrificial oxide layer is then etched away and the structure is heated. This short sequence of steps allows to heal possible damage (caused by the gate formation RIE and ion implantation) of the silicon 30 at the bottom of gate hole 40.

In an alternative embodiment, the RIE process for gate hole formation may be designed such that the dielectric stack as well as the pad oxide layer 35 are etched. In this case, the selectivity to silicon of the second RIE etch process needs to be appropriate, because otherwise the silicon 30 at the bottom of the gate hole 40 would be etched away. Once the silicon 30 is exposed at the bottom of the hole 40, a gate oxide layer 49 may be formed by means of oxidation, as described above. Before formation of the gate oxide layer 49, the threshold adjust dopants are implanted. Then, one might grow a sacrificial oxide layer, as described above. The sacrificial oxide layer may be about 2 nm thick.

As illustrated in FIG. 3K, polysilicon 41 is now deposited in gate hole 40 and on the uppermost layer 38 of the dielectric stack. It is important to ensure that the polysilicon 41 completely fills the gate hole 40. The polysilicon may be deposited by means of LPCVD (e.g. at about 650° C.). As mentioned farther above, one may deposit amorphous silicon instead of polysilicon. The amorphous silicon can then be transformed into polysilicon at a later point in time.

The polysilicon may be un-doped or doped. Dopants can be introduced into the polysilicon either during the polysilicon deposition, or afterwards. It is an advantage of the inventive process that the polysilicon gate does not necessarily have to be doped when the source and drain regions are implanted. The polysilicon gate may in one of the subsequent fabrication steps be silicided (polycide), and a cap dielectric deposited for protection of the gate during subsequent processing, if deemed appropriate.

Figure 3L:
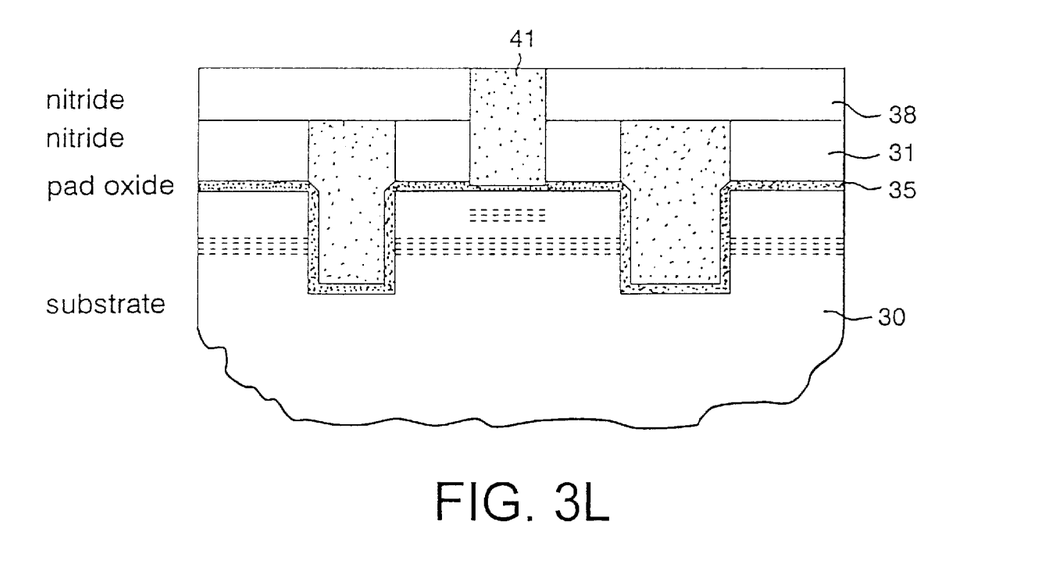
FIG. 3L shows an intermediate step where the polysilicon has been removed by means of planarization.

As mentioned farther above, any material—which is suited as gate conductor—may be "filled" into the gate hole 40. The present invention is not limited to polysilicon gates After deposition of the material 41 serving as gate conductor, a planarization step may be carried out. Well suited is a CMP process. After planarization, the uppermost layer 38 of the dielectric stack is exposed, as illustrated in FIG. 3L.

Figure 3M:
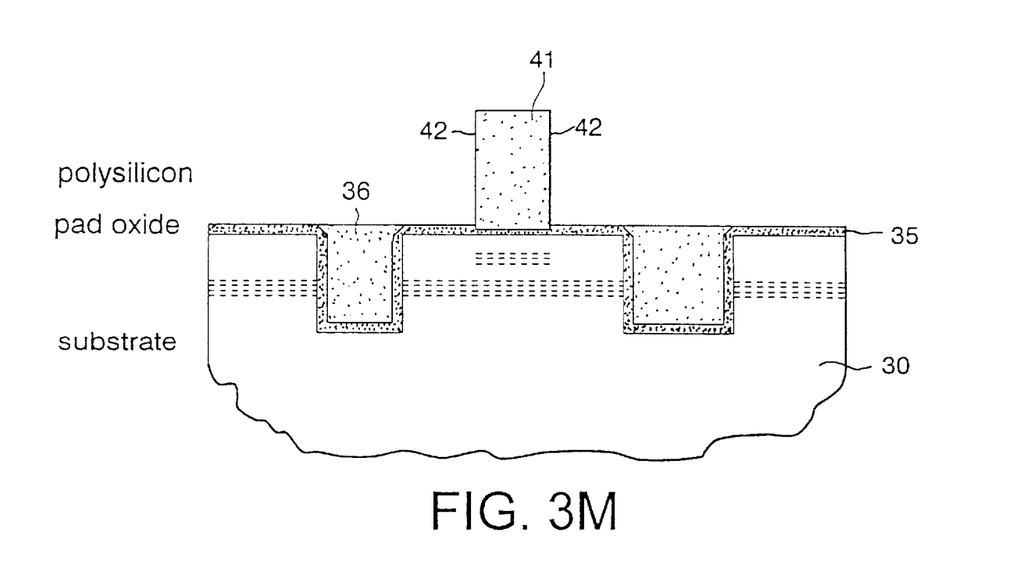
FIG. 3M shows an intermediate fabrication step where the dielectric stack, which consisted of several layers, has been removed such that a polysilicon gate pillar with vertical side walls remains.

Last but not least, the dielectric stack has to be removed. The nitride layers 38 and 31 are stripped using hot phosphoric acid. After complete removal of the dielectric stack a protruding gate pillar 41 with vertical side walls 42 is uncovered, as shown in FIG. 3M.

The processing can now be continued in a standard CMOS technology, as described in chapter 10, pages 266–269, of the book "micro electronics processing and device design", by R. A. Colclaser, John Wiley & Sons, 1980 for example.

Figure 3N:
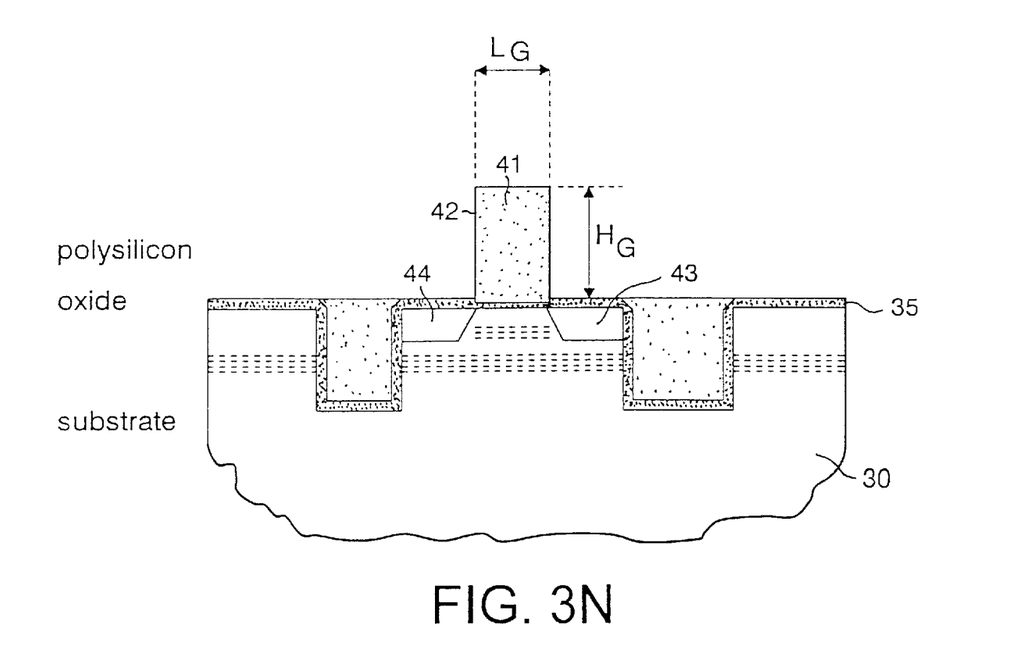
FIG. 3N shows an intermediate fabrication step where dopants were introduced to define source and drain regions.

During the subsequent steps one may define the source 43 and drain regions 44—if not already done so earlier—by implantation of suited dopants, as shown in FIG. 3N. A channel 45 (situated underneath the gate pillar 41 and between drain 44 and source 43) is thus defined. The channel length is about the same as the gate length because the source/channel and drain/channel interfaces are steep and abrupt (well defined), and the overlap is minimized, as discussed already.

Instead of standard source and drain regions obtained by means of implantation, diffused source-drain junctions may be formed by outdiffusion from a polysilicon layer formed on the regions to be doped.

To complete the FET, electrodes have to be provided. Suitable electrodes are made of conducting material, in particular metals, such as Au, Al, Mo, Ta, Ti, Cu, or ITO (indium-tin oxide) being deposited by evaporation and etching, or other techniques. Furthermore, a metallization pattern may now be formed to interconnect adjacent FETs.

In the following, a short summary of conventional CMOS process is given. The conventional process is recapitulated to underline the inherent differences of the inventive process and conventional processes. After formation of STI or LOCOs isolations, the nitride and pad oxide layers are stripped away. Then a sacrificial oxide layer is usually grown. Now, p-well and/or n-well deep implants are performed followed by the threshold adjust implant process. As illustrated in FIG. 1B, the p-well and n-well deep implants as well as the threshold adjust implants extend across the whole wafer. After ion implantation, the sacrificial oxide is removed and a gate oxide layer 15 is grown. In a subsequent step a polysilicon layer is deposited. This polysilicon layer is then defined using photo lithography and RIE etching. The result of this process is a MOSFET 10 having sloped side walls 6 as illustrated in FIG. 1A.

The above embodiment and the alternative embodiments addressed above can be modified in various manners, as outlined below.

The $n^+$ doped regions can be replaced by $p^+$ doped regions, for instance. The size and shape of the doped regions can be varied. The substrate could be a p-doped or n-doped Silicon substrate, or a Silicon-On-Insulator (SOI) substrate, just to mention some possible modifications. The deep well implants can be used to define a p-doped region within an n-doped substrate, for example. This allows to form n-type FETs (also referred to as n-channel FETs or NMOS) within the p-doped region, whereas p-type FETs (also referred to as p-channel FETs or PMOS) can be formed in the n-doped substrate directly. In CMOS technology, the p-well or n-well diffusion is carried out before the source and drain regions are formed.

The inventive method is well suited for the formation of transistors with grounded plane. This can be achieved by introducing a high concentration of dopants through the gate hole into a highly doped substrate ($\sim 1\times 10^{19}/cm^3$). For the device region, low concentration epitaxy ($\sim 1\times 10^{15}/cm^3$) may be used. Due to the fact that the implantation of dopants is done through the gate hole, the dopants are accurately localized and aligned underneath the gate conductor to be formed. Provided that the concentration of dopants is high enough (above $1\times 10^{19}/cm^3$), these dopants behave almost like a metal grounded plan.

NMOS as well as PMOS FETs can be formed by means of the inventive process. MOS FETs of different channel type and structure may be made within one and the same substrate.

The process according to the present invention also has great potential for fabrication of sub-half micron devices. Please note that a sub-0.1 micron device is a device with gate length L<0.1 μm.

One can also make sub-lithographic structures using the method described and claimed in co-pending patent application 08/026,261, entitled "METHOD FOR MAKING FIELD EFFECT TRANSISTORS HAVING SUB-LITHOGRAPHIC GATES WITH VERTICAL SIDE WALLS", filed on the same day and presently assigned to the assignee of the instant application. The disclosure of this co-pending patent application is incorporated herein by reference.

The width and length of the gate hole may be reduced by formation of side wall spacers before implanting the threshold adjust and/or punch through dopants. One might also form first side wall spacers before implanting the threshold adjust dopants, and then remove these spacers and form second spacers before implanting the punch through dopants. This allows to even better control the size and shape of the respective implant regions.

FETs according to the present invention can be used in many different kinds of circuits, such as high performance logic, low power logic or high density memory devices, including high density multi-gigabit DRAMs. The inventive FETs can easily be combined with other elements, such as for example capacitors, resistors, diodes, memory cells and so forth. Because of their small size and ease of fabrication, the present FETs are also suited for use in connection with organic displays or liquid crystal displays (LCDs).

What is claimed is:

1. A method for making a metal oxide semiconductor field effect transistor (MOSFET) comprising the steps of:

forming a dielectric stack on a semiconductor structure;

defining an etch window on the dielectric stack having lateral size and shape of a gate hole to be formed;

defining the gate hole in the dielectric stack by transferring the etch window into the dielectric stack using a reactive ion etching (RIE) process;

implanting threshold adjust dopants or punch through adjust dopants through the gate hole;

depositing a gate conductor such that said gate conductor fills the gate hole; and removing at least part of the dielectric stack, wherein said transistor is a sub-0.1 micron device with a gate length of less than 0.1 μm.

2. The method of claim 1, wherein the threshold adjust dopants and the punch through adjust dopants are implanted through the gate hole.

3. The method of claim 1, wherein semiconductor structure at least comprises a pad oxide layer.

4. The method of claim 3, wherein the pad oxide layer is between 5 nm and 20 nm thick.

5. The method of claim 1, wherein the dielectric stack comprises a nitride layer, preferably a $Si_3N_4$ layer.

6. The method of claim 1, wherein the dielectric stack comprises a tetra ethyl ortho silicate (TEOS) layer.

7. The method of claim 1, wherein the etch window is defined using a resist and a subsequent photo lithographic process.

8. The method of claim 1, wherein the etch window is transferred into the dielectric stack using a sequence of reactive ion etching (RIE) steps.

9. The method of claim 8, wherein each step of the sequence of reactive ion etching (RIE) steps is optimized for the respective layer of the dielectric stack it is supposed to etch.

10. The method of claim 8, wherein the sequence of reactive ion etching (RIE) steps is optimized to etch a gate hole with vertical side walls throughout the dielectric stack.

11. The method of claim 1, wherein the pad oxide layer at the bottom of the gate hole is removed after the step of defining a gate hole in the dielectric stack.

12. The method of claim 11, wherein the pad oxide layer at the bottom of the gate hole is removed using a wet etch.

13. The method of claim 11, wherein the implanting of threshold adjust dopants or the implanting of punch through dopants is carried out before the removal of pad oxide layer.

14. The method of claim 11, wherein the implanting of threshold adjust dopants or the implanting of punch through dopants is carried out after the removal of pad oxide layer.

15. The method of claim 1, wherein a thin gate oxide is formed at the bottom of the gate hole after the step of implanting of threshold adjust dopants or punch through dopants.

16. The method of claim 15, wherein the thin gate oxide is formed thermally.

17. The method of claim 15, wherein the thin gate oxide has a thickness of less than 5 nm.

18. The method of claim 1, wherein the gate conductor comprises polysilicon or Tungsten.

19. The method of claim 1, wherein a chemical mechanical polishing (CMP) process is used for removing the gate conductor covering, the portions of the dielectric stack surrounding the gate hole.

20. The method of claim 1, wherein the metal oxide semiconductor field effect transistor is a PMOS, NMOS, or CMOS transistor.

21. The method of claim 1, wherein a step of implanting deep implants is carried out before the defining of an etch window.

22. The method of claim 21, wherein the deep implants have a dopant concentration of about $1 \times 10^{16}/cm^3$.

23. The method of claim 1, wherein the threshold adjust implant region and punch through adjust region has a dopant concentration between $1 \times 10^{17} cm^3$ and $1 \times 10^{18}/cm^3$.

24. The method of claim 1, wherein source and drain regions are formed by implantation of dopants after the step of removing at least part of the dielectric stack, said source and drain regions each having an abrupt junction to the channel which is situated underneath the edge of the gate pillar and gate oxide.

25. The method of claim 24, wherein the junctions between the source region and channel region and the drain region and channel region are well defined.

26. The method of claim 24, wherein the slope of the junctions between the source region and channel region and the drain region and channel region are steep.

27. The method of claim 1, wherein the effective gate length is defined by the length of the gate pillar.

28. The method of claim 1, wherein a high dose of dopants is implanted through the gate hole such that these dopants serve as grounded plane for the respective transistor.

29. A method for making a metal oxide semiconductor field effect transistor (MOSFET) comprising the steps of:

forming a dielectric stack on a semiconductor structure;

defining an etch window on the dielectric stack having lateral size and shape of a gate hole to be formed;

defining the gate hole in the dielectric stack by transferring the etch window into the dielectric stack using a reactive ion etching (RIE) process;

implanting threshold adjust dopants or punch through adjust dopants through the gate hole;

forming a sacrificial oxide layer at the bottom of said gate hole;

etching said sacrificial oxide layer in said gate hole;

heating said structure so as to heal any damage in said structure caused by said RIE or implanting steps;

depositing a gate conductor such that said gate conductor fills the gate hole; and removing at least part of the dielectric stack.

* * * * *